US012698559B2

(12) United States Patent
Chandra et al.

(10) Patent No.: US 12,698,559 B2
(45) Date of Patent: Aug. 4, 2026

(54) METHOD FOR DEPOSITING A FILM

(71) Applicant: VERSUM MATERIALS US, LLC, Tempe, AZ (US)

(72) Inventors: Haripin Chandra, San Marcos, CA (US); Xinjian Lei, Vista, CA (US); Daniel P. Spence, Carlsbad, CA (US); Manchao Xiao, San Diego, CA (US); Ronald Martin Pearlstein, San Marcos, CA (US); Matthew R. Macdonald, Mission Viejo, CA (US); Madhukar B. Rao, Carlsbad, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 17/788,211

(22) PCT Filed: Dec. 22, 2020

(86) PCT No.: PCT/US2020/066553

§ 371 (c)(1),
(2) Date: Jun. 22, 2022

(87) PCT Pub. No.: WO2021/133774

PCT Pub. Date: Jul. 1, 2021

(65) Prior Publication Data

US 2023/0058258 A1 Feb. 23, 2023

Related U.S. Application Data

(60) Provisional application No. 62/954,053, filed on Dec. 27, 2019.

(51) Int. Cl.

| | |
|---|---|
| ***C23C 16/04*** | (2006.01) |
| ***C23C 16/34*** | (2006.01) |
| ***C23C 16/40*** | (2006.01) |
| ***C23C 16/44*** | (2006.01) |
| ***C23C 16/455*** | (2006.01) |

(52) U.S. Cl.

CPC ............ *C23C 16/04* (2013.01); *C23C 16/345* (2013.01); *C23C 16/402* (2013.01); *C23C 16/4408* (2013.01); *C23C 16/45534* (2013.01); *C23C 16/45536* (2013.01); *C23C 16/45553* (2013.01)

(58) Field of Classification Search

CPC ..... C23C 16/04; C23C 16/345; C23C 16/402; C23C 16/4408; C23C 16/45534; C23C 16/45536; C23C 16/45553

See application file for complete search history.

(56) References Cited

U.S. PATENT DOCUMENTS

| | | | | |
|---|---|---|---|---|
| 9,812,320 | B1 | 11/2017 | Viljami et al. | |
| 9,945,028 | B2 | 4/2018 | Shimizu | |
| 10,103,026 | B2 | 10/2018 | Moon et al. | |
| 10,199,212 | B2 | 2/2019 | Smith | |
| 2008/0242097 | A1 | 10/2008 | Boescke | |
| 2010/0048837 | A1* | 2/2010 | Martin | C08F 10/02 526/74 |
| 2012/0052681 | A1 | 3/2012 | Marsh et al. | |
| 2012/0168772 | A1 | 7/2012 | Collazo et al. | |
| 2012/0302071 | A1 | 11/2012 | Lee | |
| 2013/0078392 | A1* | 3/2013 | Xiao | H01L 21/0228 546/14 |
| 2013/0295779 | A1 | 11/2013 | Chandra | |
| 2016/0064275 | A1 | 3/2016 | Liu | |
| 2017/0092495 | A1* | 3/2017 | Chen | G03F 7/091 |
| 2017/0114459 | A1* | 4/2017 | Saly | C23C 16/345 |
| 2018/0005814 | A1 | 1/2018 | Kumar et al. | |
| 2018/0269058 | A1 | 9/2018 | Smith | |
| 2019/0148144 | A1 | 5/2019 | Liu | |
| 2019/0203354 | A1 | 7/2019 | Smith | |
| 2021/0115559 | A1 | 4/2021 | Sharma | |

FOREIGN PATENT DOCUMENTS

| | | | | | |
|---|---|---|---|---|---|
| CN | 106558477 | A | | 4/2017 | |
| CN | 103374708 | B | | 5/2017 | |
| JP | 2013-135154 | | * | 7/2013 | |
| JP | 2017528597 | A | | 9/2017 | |
| JP | 2018164079 | A | | 10/2018 | |
| JP | 2018533218 | A | | 11/2018 | |
| KR | 20180129210 | A | * | 12/2018 | H01L 21/02189 |
| TW | 201908506 | A | | 3/2019 | |
| TW | 201925513 | A | | 7/2019 | |
| WO | 2007026010 | | | 3/2007 | |
| WO | 2007026010 | A2 | | 3/2007 | |
| WO | 2019143608 | A1 | | 7/2019 | |
| WO | WO2021133774 | A1 | | 7/2021 | |

* cited by examiner

*Primary Examiner* — David P Turocy
(74) *Attorney, Agent, or Firm* — Versum Materials US, LLC; Daniel Roth

(57) ABSTRACT

An atomic layer deposition method for depositing a film into surface features of a substrate is disclosed. The method may include the step of placing the substrate having surface features into a reactor. An organic passivation agent may be introduced into the reactor, which may react with a portion of exposed hydroxyl radicals within the surface features. Subsequently, unreacted organic passivation agent may be purged, and then a precursor may be introduced. The precursor may react with the remaining exposed hydroxyl radicals that did not interact with the organic passivation agent. Subsequently, the unreacted precursor may be purged, and an oxygen source or a nitrogen source may be introduced into the reactor to form a film within the surface features.

11 Claims, No Drawings

METHOD FOR DEPOSITING A FILM

CROSS-REFERENCE TO RELATED APPLICATION

This application for a patent claims priority to U.S. Provisional Patent Application No. 62/954,053 filed on Dec. 27, 2019.

TECHNICAL FIELD

In general, this disclosure relates to a method for depositing a film, and more particularly, to an atomic layer deposition method for depositing a film into a surface feature of a substrate.

BACKGROUND

Atomic layer deposition is a chemical process utilized to deposit a thin film on a substrate. In many instances the substrate undergoing the atomic layer deposition process includes one or more of the following high aspect ratio surface features formed therein: pores, trenches, shallow trench isolation, vias, reentrant feature, or the like. These high aspect features commonly include an opening, a top area, and a bottom area, and the film formed therein should be low in porosity.

In conventional atomic layer deposition, the opening to the surface feature narrows as film growth occurs during gap-fill. Eventually, the narrowing of the opening prohibits travel of reactants to lower parts of the surface feature, including both the top area and the bottom area. This restriction impedes further film growth inside the surface feature, thereby leading to a film formed within the surface feature with greater than desired porosity.

US Patent Application Publication No. 2019/0203354 A1 discloses a method and system for conformality modulation of metal oxide films in atomic layer deposition using chemical inhibition. Inhibiting precursors for metal oxide deposition may include chelating agents such as diketones.

U.S. Pat. Nos. 10,199,212 and 10,043,656 teach methods and apparatuses for selectively depositing silicon-containing or metal-containing dielectric material on silicon or metal surfaces selective to silicon oxide or silicon nitride materials. Acetyl chloride is used as a blocking agent.

Accordingly, the present disclosure is directed to overcoming one or more problems set forth above, and/or other problems associated with known atomic layer deposition methods.

SUMMARY OF THE INVENTION

In accordance with one aspect of the present invention, an atomic layer deposition method for depositing a film into surface features of a substrate is disclosed. The method may include placing the substrate having surface features into a reactor, and the surface features may comprise exposed hydroxyl radicals. The reactor may be heated to one or more temperatures ranging from ambient temperature to about 700° C. and optionally maintaining its pressure of 100 torr or less. Subsequently, an organic passivation agent may be introduced into the reactor, and it may react with a portion of the exposed hydroxyl groups of the surface features.

The reactor may then be purged of unreacted organic passivation agent using an inert gas, and subsequently a precursor gas having at least one organoamino group may be introduced to react with unreacted hydroxyl groups of the surface features. Following this, an inert gas may be introduced to the reactor in order to purge unreacted precursor, and then an oxygen source or a nitrogen source may be introduced to form the film in the surface features. Finally, the reactor may be purged of the unreacted oxygen source or nitrogen source and any by-products with an inert gas. The steps from introducing the surface features to the organic passivation agent, to purging the reactor of unreacted oxygen source or nitrogen source and by-products with an inert gas, may be repeated until the surface features are filled from the bottom-up.

In general, the organic passivation agent may be selected from acetals, ketals, orthoesters, and orthocarbonates. More specifically, the organic passivation agent is selected from the group consisting of the following formulae:

acetals or ketals having a formula of $R^1R^2C(OR^3)_2$ I.

orthoesters having a formula of $R^1C(OR^3)_3$ and II.

orthocarbonates having a formula of $C(OR^3)_4$ III.

wherein $R^1$ is selected from the group consisting of hydrogen, $C_1$ to $C_{10}$ linear or branched alkyl, $C_3$ to $C_{10}$ linear or branched alkyl containing oxygen or nitrogen, $C_3$ to $C_{10}$ linear or branched cyclic alkyl, $C_2$ to $C_{10}$ alkenyl, $C_2$ to $C_{10}$ alkynyl, and $C_3$ to $C_{10}$ aromatic hydrocarbon $R^2$ and $R^3$ are independently selected from the group consisting of $C_1$ to $C_{10}$ linear or branched alkyl, $C_3$ to $C_{10}$ linear or branched alkyl containing oxygen or nitrogen, $C_3$ to $C_{10}$ linear or branched cyclic alkyl, $C_2$ to $C_{10}$ alkenyl, $C_2$ to $C_{10}$ alkynyl, and $C_3$ to $C_{10}$ aromatic hydrocarbon.

In an exemplary embodiment, the organic passivation agent is at least one compound selected from the group consisting of tetramethyl orthocarbonate, tetraethyl orthocarbonate, tetra-n-propyl orthocarbonate, trimethyl orthoacetate, triethyl orthoacetate, 1,1,1-triethoxypentane, 1,1,1-triethoxyheptane, triethyl orthobenzoate, 2,2-diethoxypropane, 1,1-diethoxy-1-phenylethane, 4,4-diethoxyheptane, 4,4-diethoxynonane, trimethyl orthoformate, trimethyl triethyl orthoformate, and tri-n-propyl orthoformate.

The precursor may be selected from the group consisting of organoaminosilanes, organoaminodisilanes, organoaminotrisilylamines, organoaminosiloxanes, organoaminocyclosiloxanes, and organoaminotitanium, organoaminohafnium, organoaminozirconium, organoaminotantalum, organoaminotungsten, organoaminomolybdenum, organoaminoaluminum, alkylaluminum, and metal alkoxides. In addition, the oxygen source is selected from the group consisting of oxygen, oxygen plasma, water vapor plasma, a mixture of water and organic amine, hydrogen peroxide, nitrous oxide, ozone, carbon dioxide plasma, carbon monoxide plasma, and combinations thereof. And the nitrogen source may be selected from the group consisting of ammonia, hydrazine, methylhydrazine, 1,1-dimethylhydrazine, $N_2$ plasma, ammonia plasma, hydrogen/nitrogen plasma, and combinations thereof.

The surface features of the present disclosure may have a depth to width aspect ratio of at least 2:1 or higher, or even at least 4:1. In some instances, the surface features have a width of 100 nm or less, may be vias, may be trenches, or a combination of vias and trenches.

In an embodiment, the thickness of the film produced each time after performing the steps from introducing the surface features to the organic passivation agent, to purging the reactor of unreacted oxygen source or nitrogen source and by-products with an inert gas, is thicker toward the bottom of the surface features than toward the top of the surface feature.

DETAILED DESCRIPTION OF THE INVENTION

Described herein are compositions and processes related to fill a surface feature such as a via or a trench with a silicon or metal oxide containing film in an atomic layer deposition (ALD) process, or in an ALD-like process, such as, and without limitation, cyclical chemical vapor deposition. According to an exemplary embodiment, non-silicon containing passivation agent reacts with exposed hydroxyl groups on substrate surface features resulting in "occupied" reactive sites on the surface features. Occupation of the reactive sites in turn prevents reaction of organoaminosilane with the occupied reactive sites, hence, preventing film growth on certain area of the surface features. The dose of passivation agent is controlled in order to limit diffusion of the passivation agent into lower areas in the surface features. Therefore, the upper substrate surface and upper parts of the surface features will be passivated more than bottom part of the trench structure, which in turn imparts lower film growth near the upper substrate surface and upper parts of the surface features and higher film growth near bottom of the substrate features. This method of limiting film growth at near the upper substrate surface and upper parts of the surface features maintains an opening for precursor and oxygen source to access the lower spaces in the surface features and completely fill such spaces with the film of interest.

When no passivation agent is used during film growth, such as in a conventional ALD conformal film growth method, the opening in the surface feature narrows as film growth occurs during gap-fill. Eventually, this narrowing prohibits access to the lower parts of the surface features and in turn impedes further film growth inside the trench resulting in porosity within the surface features. Similar defect phenomena are also observed when passivation agent diffuses into bottom of the trench, resulting in conformal film growth during trench filling.

One method described according to an exemplary embodiment comprises:

a) placing one or more substrates having high aspect ratio surface features with hydroxyl groups on the surface into a reactor;
b) heating the reactor to one or more temperatures ranging from ambient temperature to about 700° C. and optionally maintaining the reactor at a pressure of 100 torr or less;
c) introducing into the reactor at least one organic passivation agent to react with those hydroxyl groups on the top surface area of the features
d) purging unreacted organic passivation agent away using inert gas;
e) Introducing vapors of a depositing precursor having at least one organoamino group to react with those unreacted hydroxyl groups;
f) purging unreacted precursors away using inert gas;
g) introducing an oxygen source precursor; and
h) purging with inert gas wherein steps c through h are repeated until the features are filled from the bottom-up. Another method described according to an exemplary embodiment comprises:

a) introduce silicon substrate having suitable topography into a deposition chamber;
b) heating the reactor to one or more temperatures ranging from ambient temperature to about 700° C. and optionally maintaining the reactor at a pressure of 100 torr or less;
c) introducing into the reactor at least one organic passivation agent to react with those hydroxyl groups on the top surface area of the features
d) purging unreacted organic passivation agent away using inert gas;
e) Introducing vapors of a depositing precursor having at least one organoamino or halogeno group to react with those unpassivated surfaces;
f) purging unreacted precursors away using inert gas;
g) introducing a nitrogen source precursor; and
h) purging with inert gas.

The organic passivation agent described in this invention is selected from the group consisting of the following formulae:

acetals or ketals having a formula of $R^1R^2C(OR^3)_2$ IV.

orthoesters having a formula of $R^1C(OR^3)_3$ and V.

orthocarbonates having a formula of $C(OR^3)_4$ VI.

wherein $R^1$ is selected from the group consisting of hydrogen, $C_1$ to $C_{10}$ linear or branched alkyl, $C_3$ to $C_{10}$ linear or branched alkyl containing oxygen or nitrogen, $C_3$ to $C_{10}$ linear or branched cyclic alkyl, $C_2$ to $C_{10}$ alkenyl, $C_2$ to $C_{10}$ alkynyl, and $C_3$ to $C_{10}$ aromatic hydrocarbon. $R^2$ and $R^3$ are independently selected from the group consisting of $C_1$ to $C_{10}$ linear or branched alkyl, $C_3$ to $C_{10}$ linear or branched alkyl containing oxygen or nitrogen, $C_3$ to $C_{10}$ linear or branched cyclic alkyl, $C_2$ to $C_{10}$ alkenyl, $C_2$ to $C_{10}$ alkynyl, and $C_3$ to $C_{10}$ aromatic hydrocarbon.

In one or more embodiments described above, the oxygen source is selected from the group consisting of oxygen, oxygen plasma, water vapor plasma, a mixture of water and organic amine, hydrogen peroxide, nitrous oxide, ozone, carbon dioxide plasma, carbon monoxide plasma, and combinations thereof.

In one or more of the embodiments described above, the nitrogen source includes, but are not limited to, ammonia, hydrazine, methylhydrazine, 1,1-dimethylhydrazine, $N_2$ plasma, ammonia plasma, hydrogen/nitrogen plasma, and combinations thereof.

Not to be bound by theory, it is believed that the organic passivation agents are introduced via diligently controlling chamber pressures or pulsing time or vapor flux of the organic passivation agent or size of $R^{1-3}$ groups in formulae I to III in step c to mainly react with those hydroxy groups on the top surface area of the features, allowing the depositing precursor having at least one organoamino group to react with those unreacted hydroxyls on the bottom of the features in step e to anchor silicon or metal containing fragments. As a result, bottom-up deposition of silicon or metal oxide containing film can be achieved because step g regenerates those hydroxyls on the on top surface area of the features via oxidizing the organic passivation layer away whiles silicon or metal oxide containing film is formed on the bottom of the features.

Some exemplary organic passivation agents that may be utilized in the process described herein are depicted in Table 1 below.

TABLE 1

| Exemplary Passivation Agents |
| --- |
| 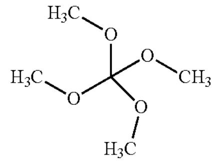 |

TABLE 1-continued

| Exemplary Passivation Agents |
| --- |
| Tetramethyl orthocarbonate |
| 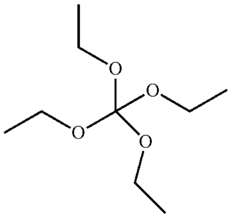 |
| Tetraethyl orthocarbonate |
| 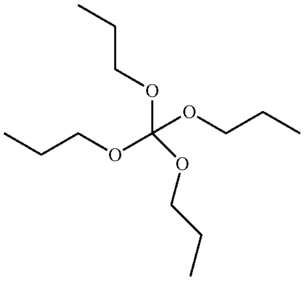 [SMILES: CCCOC(OCCC)(OCCC)OCCC] |
| Tetra-n-propyl orthocarbonate |
| 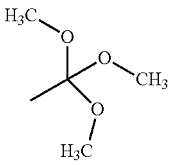 |
| Trimethyl orthoacetate |
| 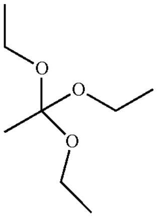 |
| Triethylorthoacetate |
| 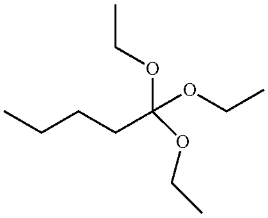 |
| 1,1,1-triethoxypentane |

TABLE 1-continued

| Exemplary Passivation Agents |
| --- |
| 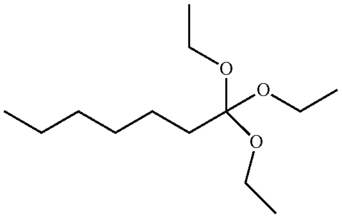 [SMILES: CCCCCCC(OCC)(OCC)OCC] |
| 1,1,1-triethoxyheptane |
| 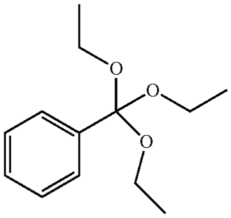 [SMILES: CCOC(OCC)(OCC)c1ccccc1] |
| Triethyl orthobenzoate |
| 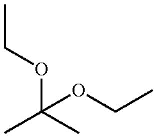 |
| 2,2-diethoxypropane |
| 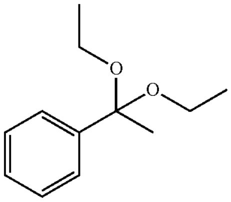 |
| 1,1-diethoxy-1-phenylethane |
| 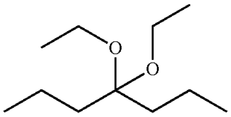 |
| 4,4-diethoxyheptane |
| 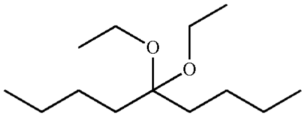 |
| 4,4-diethoxynonane |
| 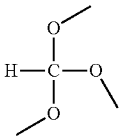 |
| Trimethyl orthoformate |

TABLE 1-continued

| Exemplary Passivation Agents |
| --- |
| 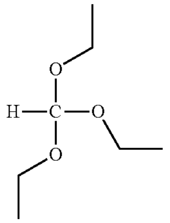 |
| Triethyl orthoformate |
| 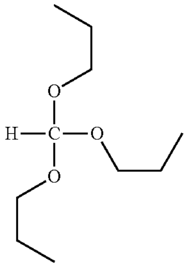 |
| Tri-n-propyl orthoformate |

The depositing precursor for silicon oxide, silicon nitride, metal nitride or metal oxide having at least one organoamino or halogeno group can be selected from the group consisting of organoaminosilanes, organoaminodisilanes, organoaminotrisilylamines, organoaminosiloxanes, organoaminocyclosiloxanes, organoaminotitanium, organoaminohafnium, organoaminozirconium, organoaminotantalum, organoaminotungsten, organoaminomolybdenum, organoaminoaluminum, alkylaluminum, metal alkoxides, and any other silicon or metal containing precursors that may be utilized to deposit silicon oxide, carbon doped silicon oxide, and metal oxide.

Examples of organoaminosilanes include, but are not limited to di-iso-propylaminosilane, di-sec-butylaminosilane, bis(diethylamino)silane, bis(dimethylamino)silane, bis (ethylmethylamino)silane, bis(tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, iso-propylaminotrimethylsilane, tert-butylaminotrimethylsilane, iso-butylaminotrimethylsilane, cyclohexaminotrimethylsilane, pyrrolidinotrimethylsilane, 2-methylpyrrolidinotrimethylsilane, 2,5-dimethylpyrrolidinotrimethylsilane, piperidinotrimethylsilane, 2,6-dimethylpiperidinotrimethylsilane, 1-methylpiperazinotrimethylsilane, pyrrolyltrimethylsilane, 2,5-dimethylpyrrolyltrimethylsilane, and imidazolyltrimethylsilane.

Examples of organoaminodisilanes include, but are not limited to, di-iso-propylaminodisilane, and di-sec-butylaminodisilane.

Examples of organoaminotrisilylamines include, but are not limited to, di-iso-propylaminotrisilylamine, diethylaminotrisilylamine, iso-propylaminotrisilylamine, and cyclohexylmethylaminotrisilylamine.

Examples of organoaminosiloxanes include, but are not limited to, 1-dimethylamino-pentamethyldisiloxane, 1-diethylamino-pentamethyldisiloxane, 1-ethylmethylamino-pentamethyldisiloxane, 1,3-bis(dimethylamino)tetramethyldisiloxane, 1-dimethylamino-heptamethyltrisiloxane, and 1,5-bis(dimethylamino)hexamethyltrisiloxane.

Examples of organoaminocyclosiloxanes include, but are not limited to, 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethylamino-2,4,6-trimethylcyclotrisiloxane, 2-iso-propylamino-2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8-tetramethylcyclotetrasiloxane, 2-iso-propylamino-2,4,6,8-tetramethylcyclotetrasiloxane, 2-pyrrolidino-2,4,6,8-tetramethylcyclotetrasiloxane, and 2-cyclohexylmethylamino-2,4,6,8-tetramethylcyclotetrasiloxane.

Examples of organoaminotitanium include, but are not limited to, tetrakis(dimethylamino)titanium, tetrakis(diethylamino)titanium, and tetrakis(ethylmethylamino)titanium.

Examples of organoaminohafnium include, but are not limited to, tetrakis(dimethylamino)hafnium (TDMAH), tetrakis(diethylamino)hafnium (TDEAH), tetrakis(ethylmethylamino)hafnium (TEMAH), cyclopentadienyltris(dimethylamino)hafnium ($CpHf(NMe_2)_3$), methylcyclopentadienyltris(dimethylamino)hafnium ($MeCpHf(NMe_2)_3$), ethylcyclopentadienyltris(dimethylamino)hafnium ($EtCpHf(NMe_2)_3$), cyclopentadienyltris(dimethylamino)hafnium ($CpHf(NMeEt)_3$), methylcyclopentadienyltris(dimethylamino)hafnium ($MeCpHf(NMeEt)_3$), ethylcyclopentadienyltris(dimethylamino)hafnium ($EtCpHf(NMeEt)_3$), cyclopentadienyltris(dimethylamino)hafnium ($CpHf(NEt_2)_3$), methylcyclopentadienyltris(dimethylamino) hafnium ($MeCpHf(NEt_2)_3$), ethylcyclopentadienyltris(dimethylamino)hafnium ($EtCpHf(NEt_2)_3$), bis(cyclopentadienyl)bis(dimethylamino)hafnium ($Cp_2Hf(NMe_2)_2$), bis (methylcyclopentadienyl)bis(dimethylamino)hafnium ($(MeCp)_2Hf(NMe_2)_2$), bis(ethylcyclopentadienyl)bis(dimethylamino)hafnium ($(EtCp)_2Hf(NMe_2)_2$), bis(cyclopentadienyl)bis(dimethylamino)hafnium ($Cp_2Hf(NMeEt)_2$), bis (methylcyclopentadienyl)bis(dimethylamino)hafnium ($(MeCp)_2Hf(NMeEt)_2$), bis(ethylcyclopentadienyl)bis(dimethylamino)hafnium ($(EtCp)_2Hf(NMeEt)_2$), bis(cyclopentadienyl)bis(dimethylamino)hafnium ($(Cp_2Hf(NEt_2)_2$), bis(methylcyclopentadienyl)bis(dimethylamino)hafnium ($(MeCp)_2Hf(NEt_2)_3$), bis(ethylcyclopentadienyl)bis(dimethylamino)hafnium ($(EtCp)_2Hf(NEt_2)_2$), (N-methyl-2,4-cyclopentadiene-1-ethanamino]bis(dimethylamino)hafnium, (N-ethyl-2,4-cyclopentadiene-1-ethanamino]bis(dimethylamino)hafnium, (N-methyl-2,4-cyclopentadiene-1-ethanamino]bis(diethylamino)hafnium, (N-ethyl-2,4-cyclopentadiene-1-ethanamino]bis(diethylamino)hafnium, (N-methyl-2,4-cyclopentadiene-1-ethanamino] bis(ethylmethylamino)hafnium, (N-ethyl-2,4-cyclopentadiene-1-ethanamino], and bis(ethylmethylamino)hafnium.

Examples of organoaminozirconium include, but are not limited to, tetrakis(dimethylamino)zirconium (TDMAZ), tetrakis(diethylamino)zirconium(TDEAZ), tetrakis(ethylmethylamino)zirconium (TEMAZ), cyclopentadienyltris(dimethylamino)zirconium ($CpZr(NMe_2)_3$), methylcyclopentadienyltris(dimethylamino)zirconium ($MeCpZr(NMe_2)_3$), ethylcyclopentadienyltris(dimethylamino)zirconium ($EtCpZr(NMe_2)_3$), cyclopentadienyltris(dimethylamino)zirconium ($CpZr(NMeEt)_3$), methylcyclopentadienyltris(dimethylamino)zirconium ($MeCpZr(NMeEt)_3$), ethylcyclopentadienyltris(dimethylamino)zirconium ($EtCpZr(NMeEt)_3$), cyclopentadienyltris(dimethylamino)zirconium ($CpHf(NEt_2)_3$), methylcyclopentadienyltris(dimethylamino)zirconium ($MeCpZr(NEt_2)_3$), ethylcyclopentadienyltris(dimethylamino)zirconium ($EtCpZr(NEt_2)_3$), bis(cyclopentadienyl) bis(dimethylamino)zirconium ($Cp_2Zr(NMe_2)_2$), bis (methylcyclopentadienyl)bis(dimethylamino)zirconium ($(MeCp)_2Zr(NMe_2)_2$), bis(ethylcyclopentadienyl)bis(dimethylamino)zirconium ($(EtCp)_2Zr(NMe_2)_2$), bis(cyclopentadienyl)bis(dimethylamino)zirconium ($Cp_2Zr(NMeEt)_2$), bis (methylcyclopentadienyl)bis(dimethylamino)zirconium ($(MeCp)_2Zr(NMeEt)_2$), bis(ethylcyclopentadienyl)bis(dimethylamino)zirconium ($(EtCp)_2Zr(NMeEt)_2$), bis(cyclopentadienyl)bis(dimethylamino)zirconium ($(Cp_2Zr(NEt_2)_2$), bis (methylcyclopentadienyl)bis(dimethylamino)zirconium ($(MeCp)_2Zr(NEt_2)_3$), bis(ethylcyclopentadienyl)bis(dimethylamino)zirconium ($(EtCp)_2Zr(NEt_2)_2$), (N-methyl-2,4-cyclopentadiene-1-ethanamino]bis(dimethylamino)zirconium, (N-ethyl-2,4-cyclopentadiene-1-ethanamino]bis(dimethylamino)zirconium, (N-methyl-2,4-cyclopentadiene-1-ethanamino]bis(diethylamino)zirconium, (N-ethyl-2,4-cyclopentadiene-1-ethanamino]bis(diethyl amino)zirconium, (N-methyl-2,4-cyclopentadiene-1-ethanamino]bis(ethylmethylamino)zirconium, and (N-ethyl-2,4-cyclopentadiene-1-ethanamino]bis(ethylmethylamino)zirconium.

Examples of organoaminotantalum include, but are not limited to, (tert-butylimino)tris(dimethylamino)tantalum, (tert-butylimino)tris(diethylamino)tantalum, and (tert-butylimino)tris(ethylmethylamino)tantalum.

Examples of organoaminotantalum include, but are not limited to, bis(tert-butylimino)bis(dimethylamino)tungsten, bis(tert-butylimino)bis(diethylamino)tungsten, and bis(tert-butylimino)bis(ethylmethylamino)tungsten.

Examples of organoaminomolybdenum include, but are not limited to, bis(tert-butylimino)bis(dimethylamino)molybdenum, bis(tert-butylimino)bis(diethylamino)molybdenum, and bis(tert-butylimino)bis(ethylmethylamino)molybdenum.

Examples of organoaminoaluminum include, but are not limited to, tris(dimethylamino)aluminum, tris(diethylamino) aluminum, and tris(ethylmethylamino)aluminum.

Examples of alkylaluminum include, but are not limited to, trimethylaluminum, and triethylaluminum.

Examples of metal oxides include, but are not limited to, titanium iso-propoxide, titanium methoxide, titanium ethoxide, and aluminum iso-propoxide.

Examples of halogeno-silanes include: trichlorosilane, dichlorosilane, monochlorosilane, hexachlorodisilane, N-methyl-1,1,1,3,3,3-hexachlorodisilazane, silicon tetrachloride, 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetrachloro-1,3,5-trisilapentane, 1-iodo-1,3-disilacyclobutane, 1,1-diiodo-1,3-disilacyclobutane, 1,3-diiodo-1,3-disilacyclobutane, 1,1,3-triiodo-1,3-disilacyclobutane, 1,1,3,3-tetraiodo-1,3-disilacyclobutane, and 1,3-diiodo-1,3-dimethyl-1,3-disilacyclobutane, 1,1,1,4,4,4-hexachloro-1,4-disilabutane, 1,1,1,4,4,4-hexachloro-2-methyl-1,4-disilabutane, 2,2,5,5,5-pentachloro-2,5-disilapentane, 2,2,5,5-pentachloro-3-methyl-2,5-disilapentane, 2,2,5,5-tetrachloro-2,5-disilahexane 2,2,5,5-tetrachloro-3-methyl-2,5-disilahexane; 1,1,1,5,5,5-hexachloro-1,5-disilapentane, 2,2,6,6-tetrachloro-3-methyl-2,6-disilaheptane, 1,1,4,4-tetrachloro-1,4-disilapentane, 1,1,4,4-tetrachloro-2-methyl-1,4-disilapentane, 1,1,4,4,4-pentachloro-1,4-disilabutane, 1,1,4,4,4-pentachloro-2-methyl-1,4-disilabutane, 1,4,4,4-tetrachloro-1,4-disilabutane, 1,4,4,4-tetrachloro-2-methyl-1,4-disilabutane, 1,4,4-trichloro-1,4-disilapentane, 1,4,4-trichloro-2-methyl-1,4-disilapentane, 1,1,5,5,5-pentachloro-1,5-disilapentane, 1,1,5,5,5-pentachloro-2-methyl-1,5-disilapentane, 1,1,5,5-tetrachloro-1,5-disilahexane, 1,1,5,5-tetrachloro-2-methyl-1,5-disilahexane, 1,5,5,5-tetrachloro-1,5-disilapentane, 1,5,5,5-tetrachloro-2-methyl-1,5-disilapentane, 1,5,5-trichloro-1,5-disilahexane, and 1,5,5-trichloro-2-methyl-2,6-disilahexane, 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, and 1,1,1,3,3,3-hexachloro-2-ethyl-1,3-disilapropane.

The substrate comprises a surface feature. The term "surface feature(s)," or "features" as used herein, means that the substrate or partially fabricated substrate that comprises one or more of the following: pores, trenches, shallow trench isolation (STI), vias, reentrant feature, or the like. In one particular embodiment, the surface feature(s) have a width of 100 μm or less, 1 μm in width or less, or 0.5 μm in width or less, or 50 nm in width or less. In this or other embodiments, the aspect ratio (the depth to width ratio) of the surface features, if present, is 2:1 or greater, or 3:1 or greater, or 4:1 or greater, or 10:1 or greater, or 20:1 or greater, or 40:1 or greater. The high aspect ratio is referring to 2:1 or higher with width 100 nm or less, preferably 3:1 or higher with width 100 nm or less, most preferably 4:1 or higher with width 100 nm or less. The trench materials can be selected from Si, $SiO_2$, $SiN_x$, carbon doped silicon oxide or combination of thereof.

In the formulae above and throughout the description, the term "linear alkyl" denotes a linear functional group having from 1 to 10, 3 to 10, or 1 to 6 carbon atoms. In the formulae above and throughout the description, the term "branched alkyl" denotes a linear functional group having from 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

As mentioned previously, the method described herein may be used to deposit a silicon oxide or metal oxide into surface features comprising vias and/or trenches on at least a portion of a substrate. Examples of suitable substrates include, but are not limited to, silicon, $SiO_2$, titanium nitride, tungsten nitride, tantalum nitride, vanadium nitride, metals such as germanium, copper, titanium, tungsten, cobalt, ruthenium, platinum palladium, aluminum and combinations thereof.

The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD).

EXAMPLES

Example 1: Impeding Silicon Oxide Film Growth on a Trench Structure

Film depositions were performed in a 300 mm plasma enhanced atomic layer deposition (PEALD) tool using FLR design. The reactor consisted of outer and inner chamber with dedicated pressure control. Ar flows to outer chamber maintaining pressure while all reactive chemicals were flown into inner reactor for deposition. The process, and its conditions, are depicted in Table 2.

TABLE 2

Impeding Silicon Oxide Growth Process and Conditions

| | | | |
|---|---|---|---|
| a | Insert Si substrates into a reactor | | |
| b | Heat substrates to desired temperature and pump out chamber to base pressure | 15 minutes | T = 300° C. |
| c | Introduce vapors of organic passivation agent into the reactor and soak | Vary | All gas flows are stopped.<br>Throttle valve is closed to maintain chamber pressure.<br>Flow organic passivation agent using vapor draw |
| d | Purge out unreacted organic passivation agent and byproducts | 5 s | Outer chamber Ar flow = 500 sccm<br>Outer chamber pressure = 3 Torr<br>Inner (reaction) chamber:<br>Ar flow = 300 sccm<br>Pressure = 2.5 Torr |
| e | Flow a depositing precursor having at least one organoamino group | 1 s | Outer chamber Ar flow = 500 sccm<br>Outer chamber pressure = 3 Torr<br>Inner (reaction) chamber:<br>Ar flow = 300 sccm<br>Precursor Ar carrier gas = 200 sccm<br>Pressure = 2.5 Torr |
| f | Purge out unreacted precursor and by-products | 5 s | Outer chamber Ar flow = 500 sccm<br>Outer chamber pressure = 3 Torr<br>Inner (reaction) chamber:<br>Ar flow = 300 sccm<br>Pressure = 2.5 Torr |
| g | Introduce oxygen source | 2 s | Outer chamber Ar flow = 500 sccm<br>Outer chamber pressure = 3 Torr<br>Inner (reaction) chamber:<br>Ar flow = 300 sccm<br>Oxygen flow = 100 sccm<br>Plasma frequency = 13.56 MHz<br>Plasma power = 200 W<br>Pressure = 2.5 Torr |
| h | Purge out unreacted precursor and byproducts | 5 s | Outer chamber Ar flow = 500 sccm<br>Outer chamber pressure = 3 Torr<br>Inner (reaction) chamber:<br>Ar flow = 300 sccm<br>Pressure = 2.5 Torr |
| i | Remove Si substrate from the reactor for characterizing the as-deposited film | | |

Steps c to h of the above outlined process may be repeated until a desired thickness is reached.

A Filmtek™ 3000 reflection and transmission spectrometer was used to measure thickness and refractive index of the deposited film, while a scanning electron microscope (SEM) and Transmission electron microscope (TEM) were used to inspect film quality.

A blanket film of silicon oxide was deposited using di-sec-butylaminosilane (DSBAS) as the depositing precursor, 02 plasma as the oxygen source, and triethylorthoacetate (TEOA) as the organic passivation agent, utilizing the steps described in Table 2. The TEOA soaking time were varied between 0 s (no TEOA passivation agent) and 60 s. Susceptor temperature was set to 300° C.

When no TEOA soak was used (0 s), the growth per cycle (GPC) was 1.18 Å/cycle while longer TEOA soak times impeded silicon oxide film growth down to 0.16 Å/cycle.

Silicon oxide film growth using a TEOA soak time of 0.5 s was performed on a trench structure with 10:1 aspect ratio and a 150 nm opening. The TEOA exposure time was selected in sub-saturation mode, and therefor exposure of the passivating agent on top of the trench is higher than bottom of the trench. The sub-saturation mode can vary depending on the type of ALD reactors and should be obtained via similar experiments as in this example for a given ALD reactor.

TEM measurements of the deposited silicon oxide film thickness at different locations in the trench are shown in Table 3.

TABLE 3

| $SiO_2$ Film Thickness Deposited on a 10:1 Aspect Ratio Trench Structure | | | |
|---|---|---|---|
| Top | Top corner | Bottom Corner | Bottom |
| 415 Å | 425 Å | 461 Å | 465 Å |

The film thickness at the top is thinner than at the bottom, which indicates that TEOA inhibits film deposition at the top portions of the trench structure, allowing bottom-up gap-fill when shorter TEOA exposure is used.

Example 2: Blocking SiNx Growth Deposited with $N_2$ Plasma on a Trench Structure Film depositions were performed in a 300 mm PEALD tool using FLR design. The reactor consisted of outer and inner chamber with dedicated pressure control. Ar flows to outer chamber maintaining pressure while all reactive chemicals were flown into inner reactor for deposition. The process, and its conditions, are depicted below in Table 4.

TABLE 4

| Blocking SiNx Growth Process and Conditions | | |
|---|---|---|
| 1. Insert Si substrates into a reactor | | |
| 2. Heat substrates to desired temperature | 15 minutes T = 300° C. | |
| 3. Pump out chamber to base pressure | 30 s | |
| 4. Soak using organic blocker precursor | Vary | All gas is stopped.<br>Throttle valve is closed to maintain chamber pressure.<br>Flow organic precursor using vapor draw |
| 5. Purge precursor | 10 s | Outer chamber Ar flow = 500 sccm<br>Outer chamber pressure = 3 Torr<br>Inner (reaction) chamber:<br>Ar flow = 300 sccm<br>Pressure = 2.5 Torr |
| 6. Flow the silicon precursor | 1 s | Outer chamber Ar flow = 500 sccm<br>Outer chamber pressure = 3 Torr<br>Inner (reaction) chamber:<br>Ar flow = 300 sccm<br>Precursor Ar carrier gas = 200 sccm<br>Pressure = 2.5 Torr |
| 7. Purge precursor | 10 s | Outer chamber Ar flow = 500 sccm<br>Outer chamber pressure = 3 Torr<br>Inner (reaction) chamber:<br>Ar flow = 300 sccm<br>Pressure = 2.5 Torr |
| 8. Plasma for reactive gas | 10 s | Outer chamber Ar flow = 500 sccm<br>Outer chamber pressure = 3 Torr<br>Inner (reaction) chamber<br>Ar flow = 300 sccm<br>N2 flow = 100 seem<br>Pressure = 2.5 Torr |
| 9. Purge precursor | 10 s | Outer chamber Ar flow = 500 sccm<br>Outer chamber pressure = 3 Torr<br>Inner (reaction) chamber:<br>Ar flow = 300 sccm<br>Pressure = 2.5 Torr<br>Plasma: 27.1 MHz, 200 W |
| 10. Remove Si substrate from the reactor | | |

In this process, steps 3 through 9 may be repeated to obtain a desired thickness.

In this example, di-sec-butylaminosilane (DSBAS) was used as silicon precursor. Triethylorthoacetate (TEOA) was used as organic blocker with flow of 0-10 seconds. Filmtek™ 3000 reflection and transmission instrument was used to measure thickness and refractive index of deposited film.

Table 5 below shows the effect of TEOA in reducing SiNx film GPC. It demonstrates that film growth is reduced to 0.06 Å/cycle after 10 s of TEOA exposure at each cycle. This is ~45% lower GPC than film growth without TEOA passivation and proves the dose sensitivity of the passivation process.

TABLE 5

| GPC for SiNx film growth after TEOA exposure | |
|---|---|
| TEOA exposure (s) | GPC (Å/cycle) |
| 0 | 0.11 |
| 5 | 0.10 |
| 10 | 0.06 |

Silicon nitride ($SiN_x$) film growth was explored using a TEOA soak time of 0.5 s on a trench structure with 10:1 aspect ratio and a 150 nm opening. The TEOA exposure time was selected in sub-saturation mode. Therefore, exposure of passivating agent on top of the trench is higher than bottom of the trench.

TEM measurements of the deposited silicon nitride film thickness at different locations in the trench are shown in Table 6.

TABLE 6

| $SiN_x$ Film Thickness Deposited on a 10:1 Aspect Ratio Trench Structure | | | |
|---|---|---|---|
| Top | Top corner | Bottom Corner | Bottom |
| 275 Å | 280 Å | 299 Å | 306 Å |

The film thickness at the top is thinner than at the bottom, which indicates that TEOA inhibits film deposition at the top portions of the trench structure, allowing bottom-up fill film deposition possible when shorter TEOA exposure is used.

Example 3. Silicon Oxide Film Growth on a Trench Structure without Passivation Agent Film depositions were performed in a 300 mm plasma enhanced atomic layer deposition (PEALD) tool using FLR design. The reactor consisted of outer and inner chamber with dedicated pressure control. Ar flows to outer chamber maintaining pressure while all reactive chemicals were flown into inner reactor for deposition. The process, and its conditions, are depicted in Table 7.

TABLE 7

| Silicon Oxide Film Growth Without Passivation Agent Process and Conditions | | | |
|---|---|---|---|
| a | Insert Si substrates into a reactor | | |
| b | Heat substrates to desired temperature | 15 minutes | T = 300° C. |
| c | Flow the depositing precursor having at least one organoamino group | 1 s | Outer chamber Ar flow = 500 sccm<br>Outer chamber pressure = 3 Torr<br>Inner (reaction) chamber:<br>Ar flow = 300 sccm<br>Precursor Ar carrier gas = 200 sccm<br>Pressure = 2.5 Torr |
| d | Purge out unreacted precursor and byproducts | 5 s | Outer chamber Ar flow = 500 sccm<br>Outer chamber pressure = 3 Torr<br>Inner (reaction) chamber:<br>Ar flow = 300 sccm<br>Pressure = 2.5 Torr |
| e | Introduce oxygen plasma | 2 s | Outer chamber Ar flow = 500 sccm<br>Outer chamber pressure = 3 Torr<br>Inner (reaction) chamber:<br>Ar flow = 300 sccm<br>Oxygen flow = 100 sccm<br>Plasma frequency = 13.56 MHz<br>Plasma power = 200 W<br>Pressure = 2.5 Torr |
| f | Purge out unreacted precursor and byproducts | 5 s | Outer chamber Ar flow = 500 sccm<br>Outer chamber pressure = 3 Torr<br>Inner (reaction) chamber:<br>Ar flow = 300 sccm<br>Pressure = 2.5 Torr |
| g | Remove Si substrate from the reactor | | |

Steps c to f may be repeated multiple times to fill the gap.

In this example silicon oxide was deposited using di-sec-butylaminosilane (DSBAS) as the depositing precursor, and 02 plasma as the oxygen source utilizing the process and conditions laid out above in Table 7.

TEM measurements of the deposited silicon oxide film at different locations is demonstrated below in Table 8.

TABLE 8

| $SiO_2$ Film Thickness Deposited on a 10:1 Aspect Ratio Trench Structure | | | |
|---|---|---|---|
| Top | Top corner | Bottom Corner | Bottom |
| 405 Å | 410 Å | 402 Å | 409 Å |

As demonstrated above in Table 8, the film deposited without a passivation agent has a conformal film deposition.

Example 4: Film Growth Inside a Trench Structure Using Long Passivation Agent Exposure The process and conditions in this example are the same as outlined in Table 2 above except for the organic passivation agent soaking time. A blanket film of silicon oxide was deposited using di-sec-butylaminosilane (DSBAS) as the depositing precursor, $O_2$ plasma as the oxygen source, and triethylorthoacetate (TEOA) as the organic passivation agent. The TEOA soaking time were selected at 5 seconds.

TEM measurements of the deposited film thickness at different locations in the trench are shown in Table 9.

TABLE 9

| Silicon oxide film thickness deposited on 10:1 trench structure. | | | |
|---|---|---|---|
| Top | Top corner | Bottom Corner | Bottom |
| 342 Å | 350 Å | 363 Å | 345 Å |

The film thickness from top is similar to the bottom, indicating conformal deposition. This suggested longer exposure time of passivation agent may not be suitable for bottom-up fill as it reacts with surface in the trench, both top and bottom evenly.

The above description is meant to be representative only, and thus modifications may be made to the embodiments described herein without departing from the scope of the disclosure. Thus, these modifications fall within the scope of the present disclosure and are intended to fall within the appended claims.

What is claimed is:

1. An atomic layer deposition method for depositing a film into surface features of a substrate, the method comprising:

a) placing the substrate having surface features into a reactor, the surface features having exposed hydroxyl groups, wherein the surface features comprise vias, trenches, or vias and trenches, and wherein said vias and said trenches are formed with a material selected from the group consisting of silicon, silicon oxide, silicon nitride, carbon doped silicon oxide, or a combination thereof;

b) heating the reactor to one or more temperatures ranging from ambient temperature to about 700° C. and optionally maintaining the reactor at a pressure of 100 torr or less;

c) introducing into the reactor at least one organic passivation agent to react with a portion of the exposed hydroxyl groups of the surface features, wherein the organic passivation agent comprises at least one compound selected from the group consisting of tetramethyl orthocarbonate, tetraethyl orthocarbonate, tetra-n-propyl orthocarbonate, trimethyl orthoacetate, triethyl orthoacetate, 1,1,1-triethoxypentane, 1,1,1-triethoxyheptane, triethyl orthobenzoate, 2,2-diethoxypropane, 1,1-diethoxy-1-phenylethane, 4,4-diethoxyheptane, 4,4-diethoxynonane, trimethyl orthoformate, triethyl orthoformate, and tri-n-propyl orthoformate;

d) purging unreacted organic passivation agent from the reactor using inert gas;

e) introducing a precursor gas having at least one organoamino group to react with any unreacted hydroxyl groups of the surface features, wherein the precursor is selected from the group consisting of di-iso-propylaminosilane, di-sec-butylaminosilane, bis(diethylamino)silane, bis(dimethylamino)silane, bis(ethylmethylamino) silane, bis(tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, iso-propylaminotrimethylsilane, tert-butylaminotrimethylsilane, iso-butylaminotrimethylsilane, cyclohexaminotrimethylsilane, pyrrolidinotrimethylsilane, 2-methylpyrrolidinotrimethylsilane, 2,5-dimethylpyrrolidinotrimethylsilane, piperidinotrimethylsilane, 2,6-dimethylpiperidinotrimethylsilane, 1-methylpiperazinotrimethylsilane, pyrrolyltrimethylsilane, 2,5-dimethylpyrrolyltrimethylsilane, and imidazolyltrimethylsilane; di-iso-propylaminodisilane, and di-sec-butylaminodisilane; di-iso-propylaminotrisilylamine, diethylaminotrisilylamine, iso-propylaminotrisilylamine, and cyclohexylmethylaminotrisilylamine; 1-dimethylamino-pentamethyldisiloxane, 1-diethylamino-pentamethyldisiloxane, 1-ethylmethylamino-pentamethyldisiloxane, 1,3-bis(dimethylamino) tetramethyldisiloxane, 1-dimethylamino-heptamethyltrisiloxane, and 1,5-bis(dimethylamino) hexamethyltrisiloxane; 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethylamino-2,4,6-trimethylcyclotrisiloxane, 2-iso-propylamino-2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8-tetramethylcyclotetrasiloxane, 2-iso-propylamino-2,4,6,8-tetramethylcyclotetrasiloxane, 2-pyrrolidino-2,4,6,8-tetramethylcyclotetrasiloxane, and 2-cyclohexylmethylamino-2,4,6,8-tetramethylcyclotetrasiloxane; tetrakis(dimethylamino)titanium, tetrakis (diethylamino)titanium, and tetrakis(ethylmethylamino)titanium; tetrakis(dimethylamino)hafnium (TDMAH), tetrakis(diethylamino)hafnium (TDEAH), tetrakis(ethylmethylamino)hafnium (TEMAH), cyclopentadienyltris(dimethylamino)hafnium (CpHf(NMe2) 3), methylcyclopentadienyltris(dimethylamino)hafnium (MeCpHf(NMe2)3), ethylcyclopentadienyltris (dimethylamino)hafnium (EtCpHf(NMe2)3), cyclopentadienyltris(dimethylamino)hafnium (CpHf (NMeEt)3), methylcyclopentadienyltris(dimethylamino)hafnium (MeCpHf(NMeEt)3), ethylcyclopentadienyltris(dimethylamino)hafnium (EtCpHf(NMeEt) 3), cyclopentadienyltris(dimethylamino)hafnium (CpHf(NEt2)3), methylcyclopentadienyltris(dimethylamino)hafnium (MeCpHf(NEt2)3), ethylcyclopentadienyltris(dimethylamino)hafnium (EtCpHf(NEt2)3), bis (cyclopentadienyl)bis(dimethylamino)hafnium (Cp2Hf (NMe2)2), bis(methylcyclopentadienyl)bis (dimethylamino)hafnium ((MeCp)2Hf(NMe2)2), bis (ethylcyclopentadienyl)bis(dimethylamino)hafnium ((EtCp)2Hf(NMe2)2), bis(cyclopentadienyl)bis(dimethylamino)hafnium (Cp2Hf(NMeEt)2), bis(methylcyclopentadienyl)bis(dimethylamino)hafnium ((MeCp) 2Hf(NMeEt)2), bis(ethylcyclopentadienyl)bis (dimethylamino)hafnium ((EtCp)2Hf(NMeEt)2), bis (cyclopentadienyl)bis(dimethylamino)hafnium ((Cp2Hf(NEt2)2), bis(methylcyclopentadienyl)bis(dimethylamino)hafnium ((MeCp)2Hf(NEt2)3), bis(ethylcyclopentadienyl)bis(dimethylamino)hafnium ((EtCp)2Hf(NEt2)2), (N-methyl-2,4-cyclopentadiene-1-ethanamino]bis(dimethylamino)hafnium, (N-ethyl-2,4-cyclopentadiene-1-ethanamino]bis(dimethylamino) hafnium, (N-methyl-2,4-cyclopentadiene-1-ethanamino]bis(diethylamino)hafnium, (N-ethyl-2,4-cyclopentadiene-1-ethanamino]bis(diethylamino) hafnium, (N-methyl-2,4-cyclopentadiene-1-ethanamino]bis(ethylmethylamino)hafnium, (N-ethyl-2,4-cyclopentadiene-1-ethanamino], and bis (ethylmethylamino)hafnium; tetrakis(dimethylamino) zirconium (TDMAZ), tetrakis(diethylamino)zirconium (TDEAZ), tetrakis(ethylmethylamino)zirconium (TEMAZ), cyclopentadienyltris(dimethylamino)zirconium (CpZr(NMe2)3), methylcyclopentadienyltris(dimethylamino)zirconium (MeCpZr(NMe2)3), ethylcyclopentadienyltris(dimethylamino)zirconium (EtCpZr (NMe2)3), cyclopentadienyltris(dimethylamino) zirconium (CpZr(NMeEt)3), methylcyclopentadienyltris(dimethylamino)zirconium (MeCpZr(NMeEt)3), ethylcyclopentadienyltris(dimethylamino)zirconium (EtCpZr(NMeEt)3), cyclopentadienyltris(dimethylamino)zirconium (CpHf(NEt2)3), methylcyclopentadienyltris(dimethylamino)zirconium (MeCpZr(NEt2)3), ethylcyclopentadienyltris(dimethylamino)zirconium (EtCpZr(NEt2)3), bis(cyclopentadienyl)bis(dimethylamino)zirconium (Cp2Zr(NMe2) 2), bis(methylcyclopentadienyl)bis(dimethylamino) zirconium ((MeCp)2Zr(NMe2)2), bis (ethylcyclopentadienyl)bis(dimethylamino)zirconium ((EtCp)2Zr(NMe2)2), bis(cyclopentadienyl)bis(dimethylamino)zirconium (Cp2Zr(NMeEt)2), bis(methylcyclopentadienyl)bis(dimethylamino)zirconium ((MeCp)2Zr(NMeEt)2), bis(ethylcyclopentadienyl)bis (dimethylamino)zirconium ((EtCp)2Zr(NMeEt)2), bis (cyclopentadienyl)bis(dimethylamino)zirconium ((Cp2Zr(NEt2)2), bis(methylcyclopentadienyl)bis(dimethylamino)zirconium ((MeCp)2Zr(NEt2)3), bis(ethylcyclopentadienyl)bis(dimethylamino)zirconium ((EtCp)2Zr(NEt2)2), (N-methyl-2,4-cyclopentadiene-1-ethanamino]bis(dimethylamino)zirconium, (N-ethyl-2,4-cyclopentadiene-1-ethanamino]bis(dimethylamino)zirconium, (N-methyl-2,4-cyclopentadiene-1-ethanamino]bis(diethylamino)zirconium, (N-ethyl-2,4-cyclopentadiene-1-ethanamino]bis(diethylamino) zirconium, (N-methyl-2,4-cyclopentadiene-1-ethanamino]bis(ethylmethylamino)zirconium, and (N-ethyl-2,4-cyclopentadiene-1-ethanamino]bis(ethylmethylamino)zirconium; (tert-butylimino)tris(dimethylamino)tantalum, (tert-butylimino)tris(diethylamino) tantalum, and (tert-butylimino)tris(ethylmethylamino) tantalum; bis(tert-butylimino)bis(dimethylamino) tungsten, bis(tert-butylimino)bis(diethylamino) tungsten, and bis(tert-butylimino)bis (ethylmethylamino)tungsten; bis(tert-butylimino)bis (dimethylamino)molybdenum, bis(tert-butylimino)bis (diethylamino)molybdenum, and bis(tert-butylimino) bis(ethylmethylamino)molybdenum; and tris (dimethylamino)aluminum, tris(diethylamino) aluminum, and tris(ethylmethylamino)aluminum;

f) purging unreacted precursor from the reactor using inert gas;

g) introducing an oxygen source or a nitrogen source into the reactor; and h) purging unreacted oxygen source or nitrogen source and any by-products with inert gas, wherein steps c through h are repeated until the surface features are filled bottom-up.

2. The method according to claim 1, wherein the organic passivation agent comprises triethylorthoacetate.

3. The method according to claim 1, wherein the oxygen source is selected from the group consisting of oxygen, oxygen plasma, water vapor plasma, a mixture of water and organic amine, hydrogen peroxide, nitrous oxide, ozone, carbon dioxide plasma, carbon monoxide plasma, and combinations thereof.

4. The method according to claim 1, wherein the nitrogen source is selected from the group consisting of ammonia, hydrazine, methylhydrazine, 1,1-dimethylhydrazine, $N_2$ plasma, ammonia plasma, hydrogen/nitrogen plasma, and combinations thereof.

5. The method according to claim 1, wherein the surface features have a depth to width aspect ratio of at least 2:1 or higher.

6. The method according to claim 5, wherein the aspect ratio is at least 4:1.

7. The method according to claim 5, wherein the surface features have a width of 100 nm or less.

8. The method according to claim 1, wherein the surface features are vias.

9. The method according to claim 1, wherein the surface features are trenches.

10. The method according to claim 1, wherein the surface features are vias and trenches.

11. The method according to claim 1, wherein the film produced each time after performing steps c) through h) is thicker toward a bottom of the surface features than toward a top of the surface feature.

* * * * *